US008138586B2

(12) United States Patent
Trasporto et al.

(10) Patent No.: US 8,138,586 B2
(45) Date of Patent: Mar. 20, 2012

(54) INTEGRATED CIRCUIT PACKAGE SYSTEM WITH MULTI-PLANAR PADDLE

(75) Inventors: Arnel Trasporto, Singapore (SG); Sze Min Wong, Singapore (SG); Henry D. Bathan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 859 days.

(21) Appl. No.: 11/381,684

(22) Filed: May 4, 2006

(65) Prior Publication Data

US 2007/0108566 A1    May 17, 2007

Related U.S. Application Data

(60) Provisional application No. 60/678,665, filed on May 6, 2005.

(51) Int. Cl.
*H01L 23/495* (2006.01)

(52) U.S. Cl. .............. 257/676; 257/E23.037; 438/123

(58) Field of Classification Search .......... 257/666–677, 257/E23.037
See application file for complete search history.

(56) References Cited

U.S. PATENT DOCUMENTS

| 5,233,222 | A | * | 8/1993 | Djennas et al. | 257/676 |
|---|---|---|---|---|---|
| 5,235,207 | A | * | 8/1993 | Ohi et al. | 257/676 |
| 6,114,752 | A | * | 9/2000 | Huang et al. | 257/666 |
| 6,440,779 | B1 | * | 8/2002 | Chiu et al. | 438/123 |
| 6,504,238 | B2 | | 1/2003 | Cheng et al. | |
| 6,828,661 | B2 | | 12/2004 | Araki et al. | |
| 6,841,858 | B2 | * | 1/2005 | Shim et al. | 257/676 |
| 6,900,524 | B1 | | 5/2005 | Minamio et al. | |
| 6,979,886 | B2 | | 12/2005 | Hung et al. | |
| 2003/0001244 | A1 | * | 1/2003 | Araki et al. | 257/666 |
| 2003/0127711 | A1 | | 7/2003 | Kawai et al. | |
| 2006/0097282 | A1 | * | 5/2006 | Lee et al. | 257/197 |

* cited by examiner

*Primary Examiner* — Michael Lebentritt
*Assistant Examiner* — Daniel Whalen
(74) *Attorney, Agent, or Firm* — Mikio Ishimaru

(57) ABSTRACT

An integrated circuit package system includes a multi-planar paddle having an uplift rim and an attached integrated circuit over the uplift rim of the multi-planar paddle.

13 Claims, 4 Drawing Sheets

INTEGRATED CIRCUIT PACKAGE SYSTEM WITH MULTI-PLANAR PADDLE

CROSS-REFERENCES TO RELATED APPLICATIONS

This application claims the benefit of U.S. Provisional Patent Application Ser. No. 60/678,665 filed May 6, 2005, and the subject matter thereof is hereby incorporated herein by reference thereto.

TECHNICAL FIELD

The present invention relates generally to package systems, and more particularly to a system for integrated circuit packages.

BACKGROUND ART

Virtually all aspects of modern life are permeated by electronic controls, devices, etc. This has resulted in demands for more features and lower costs that require more circuitry in ever-shrinking form factors. These demands are growing at an ever-increasing rate with no apparent bounds. The underlying technology to meet the demands of our modern life involves tiny electronic circuits designed to respond and react to our world. The tiny and fragile electronic circuits are manufactured and packaged to survive our physical world to provide the functions demanded by our modern conveniences. From personal electronics to automobiles to industrial systems, the tiny, fragile electronic circuits are subjected to impacts, stress, thermal extremes, as well as carefree or careless end-users.

An integrated circuit die is a small device formed on a silicon wafer, such as a semiconductor wafer. Such an integrated circuit die is typically cut from the wafer and attached to a substrate or base carrier for redistribution of interconnects. Bond pads on the integrated circuit die are then electrically connected to the leads on the carrier via wire bonding. The integrated circuit die and wire bonds are encapsulated with a protective material such that a package is formed. The leads encapsulated in the package are redistributed in a network of conductors within the carrier and end in an array of terminal points outside the package. The terminal points allow the integrated circuit die to be electrically connected with other circuits, such as on a printed circuit board.

The integrated circuit die is typically mounted on the carrier or leadframe for positional integrity and protection from physical stress. The integrated circuit die and the leadframe are then encapsulated or packaged together for use in a system or product. In order to manufacture a leadframe, a type, and size of integrated circuit device is determined and constrains the design. Manufacturing leadframes involves different sizes, numbers and types of leads and integrated circuit die attach paddles. A large number and variety are required by the limited flexibility for integrated circuit die types and sizes. The large number and variety are further exacerbated by the demands for smaller form factors and lower costs. Current solutions continue to suffer from issues with large die applications, bond wires, lead spacing, structural integrity, and die attach options.

Thus, a need still remains for an integrated circuit package system to provide improved area, volume, and manufacturing yield with flexible die attach options. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a multi-planar paddle having an uplift rim, and attaching an integrated circuit over the uplift rim of the multi-planar paddle.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
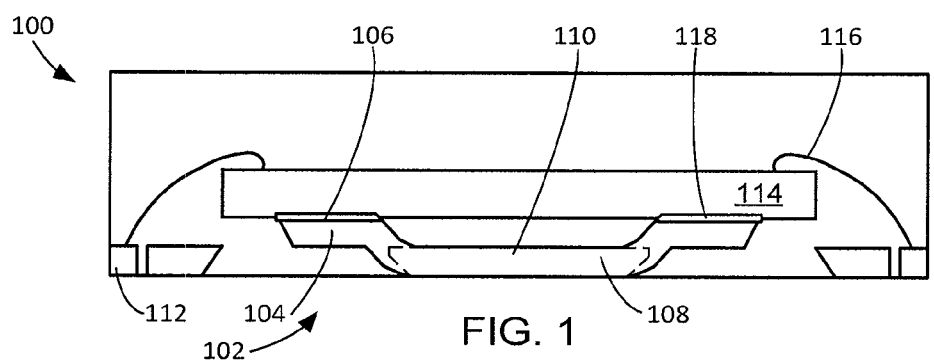
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material, patterning, exposure, development, etching, cleaning, and/or removal of the material or as required in forming a described structure.

Referring now to FIG. 1, therein is shown a cross-sectional view of an integrated circuit package system 100 in an embodiment of the present invention. The integrated circuit package system 100, such as a dual row, punch singulated, quad leadless package, includes a multi-planar paddle 102 with an uplift rim 104 having a top rim surface 106. The multi-planar paddle 102 further includes a paddle base 108 having a top base surface 110. The integrated circuit package system 100 also includes leads 112 for electrically connecting an integrated circuit 114 to a next level system. The uplift rim 104 is defined as being positioned above the paddle base 108 and the leads 112. The integrated circuit 114 is attached by electrical connectors 116, such as bond wires, to the leads 112 and by a mounting layer 118 to the top rim surface 106. The multi-planar paddle 102 provides support for the electrical connectors 116 and overhang of the integrated circuit 114 particularly in large die size applications.

It has been discovered that the integrated circuit package system 100 with the multi-planar paddle 102 prevents shorting between the integrated circuit 114 and the leads 112, provides overhang support, eases bounce effect, and improves efficiency of the electrical connectors 116.

Figure 2:
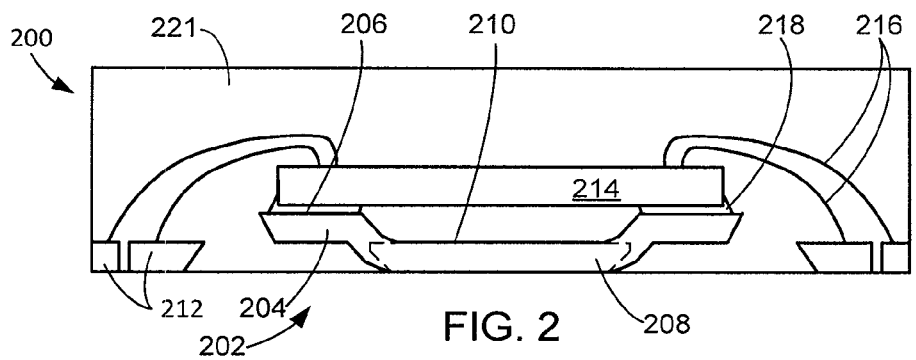
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. In a manner similar to the integrated circuit package system 100, the integrated circuit package system 200 includes a multi-planar paddle 202 with an uplift rim 204 having a top rim surface 206. The multi-planar paddle 202 further includes a paddle base 208 having a top base surface 210. The integrated circuit package system 200 also includes leads 212 in multiple rows along each side of an integrated circuit 214 for electrically connecting the integrated circuit 214. The integrated circuit 214 is attached by electrical connectors 216, such as bond wires, to the leads 212 and by a mounting layer 218 to the top rim surface 206. The multi-planar paddle 202 supports many die size applications as well as multiple rows of the leads 212. An encapsulation 221 is formed on the multi-planar paddle 202 and on the leads 212 for encapsulating the integrated circuit 214, the uplift rim 204, and the electrical connectors 216. A bottom surface of the multi-planar paddle 202 at the paddle base 208 is exposed from the encapsulation 221.

It has been discovered that the integrated circuit package system 200 with the multi-planar paddle 202 prevents shorting between the integrated circuit 214 and the leads 212, eases bounce effect, and improves efficiency of the electrical connectors 216.

Figure 3:
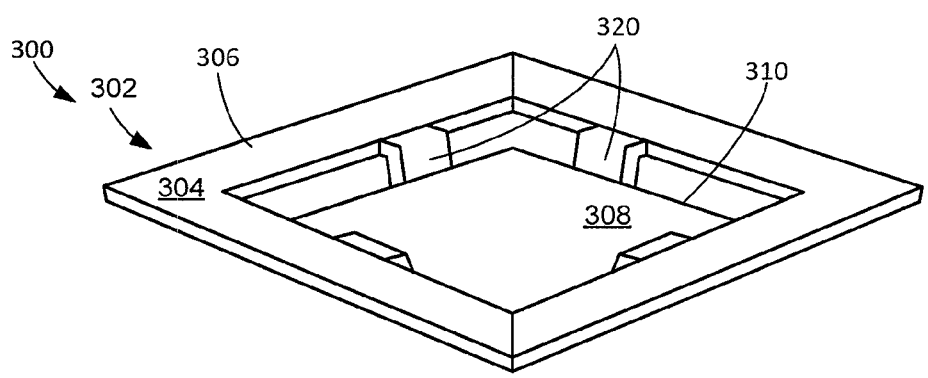
FIG. 3 is an isometric view of an integrated circuit package system in another alternative embodiment of the present invention.

Referring now to FIG. 3, therein is shown an isometric view of an integrated circuit package system 300 in another alternative embodiment of the present invention. The integrated circuit package system 300 includes a multi-planar paddle 302 with an uplift rim 304. The uplift rim 304 includes a top rim surface 306. The multi-planar paddle 302 includes a paddle base 308 having a top base surface 310 and support bars 320 to support the uplift rim 304. The uplift rim 304 is formed in a plane above a plane of the paddle base 308, thereby providing a plane of the top rim surface 306 above a plane of the top base surface 310. The support bars 320, the paddle base 308, and the uplift rim 304 form an open pad design for the multi-planar paddle 302 of the integrated circuit package system 300.

For illustrative purposes, four of the support bars 320 are shown although it is understood that any number of the support bars 320 may be used. Further, for illustrative purposes, the support bars 320 are shown as a small proportion of a width of the multi-planar paddle 302 although it is understood that any size of the support bars 320 may be used.

Figure 4:
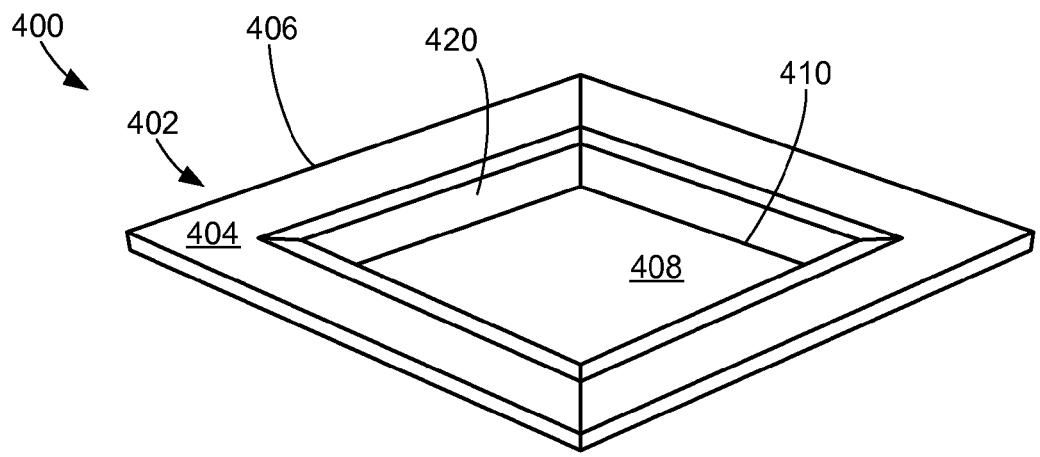
FIG. 4 is an isometric view of an integrated circuit package system in yet another alternative embodiment of the present invention.

Referring now to FIG. 4, therein is shown an isometric view of an integrated circuit package system 400 in yet another alternative embodiment of the present invention. In a manner similar to the integrated circuit package system 300, the integrated circuit package system 400 includes a multi-planar paddle 402 with an uplift rim 404. The uplift rim 404 includes a top rim surface 406. The multi-planar paddle 402 includes a paddle base 408 having a top base surface 410 and a support surface 420 to support the uplift rim 404. The uplift rim 404 is formed in a plane above a plane of the paddle base 408, thereby providing a plane of the top rim surface 406 above a plane of the top base surface 410. The support surface 420, the paddle base 408, and the uplift rim 404 form a closed pad design for the multi-planar paddle 402 of the integrated circuit package system 400.

Figure 5:
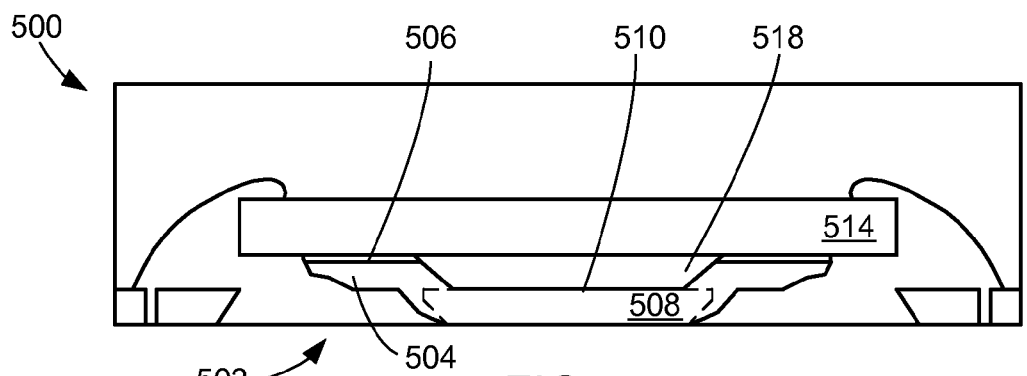
FIG. 5 is a cross-sectional view of an integrated circuit package system in yet another alternative embodiment of the present invention.

Referring now to FIG. 5, therein is shown a cross-sectional view of an integrated circuit package system 500 in yet another alternative embodiment of the present invention. In a manner similar to the integrated circuit package system 100, the integrated circuit package system 500 includes a multi-planar paddle 502 with an uplift rim 504 having a top rim surface 506. The multi-planar paddle 502 further includes a paddle base 508 having a top base surface 510. An integrated circuit 514 attaches to the multi-planar paddle 502 with a mounting layer 518, such as an epoxy. The mounting layer 518 is applied between the top rim surface 506 and the integrated circuit 514 as well as the top base surface 510 and the integrated circuit 514.

Figure 6:
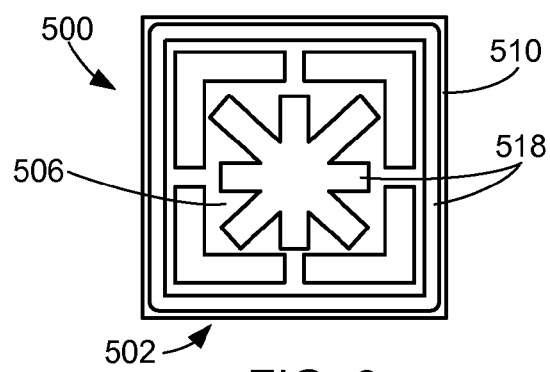
FIG. 6 is a plan view of the integrated circuit package system in a mounting layer applying phase.

Referring now to FIG. 6, therein is shown a plan view of the integrated circuit package system 500 in a mounting layer applying phase. The mounting layer 518 is applied to the multi-planar paddle 502. For the integrated circuit package system 500, the mounting layer 518 is applied to the top rim surface 506 of the uplift rim 504 of FIG. 5 and the top base surface 510 of the paddle base 508 of FIG. 5. The mounting layer 518 and the multi-planar paddle 502 provide support and adhesion to the integrated circuit 514 of FIG. 5 for overhang and bounce effect, particularly with large die applications.

Figure 7:
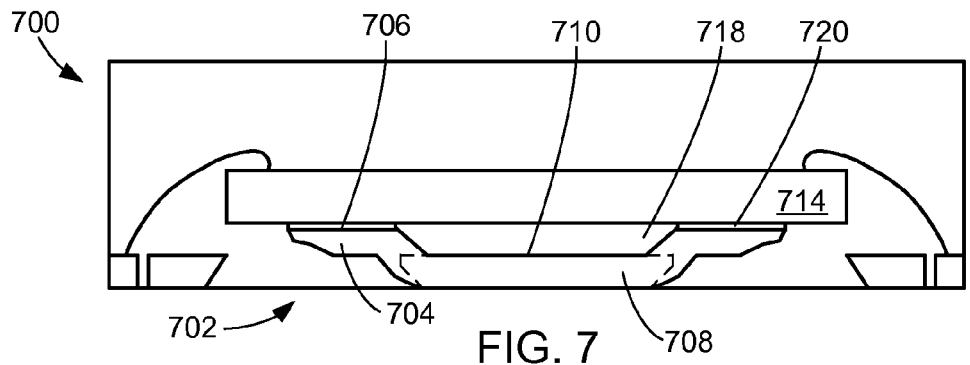
FIG. 7 is a cross-sectional view of an integrated circuit package system in yet another alternative embodiment of the present invention.

Referring now to FIG. 7, therein is shown a cross-sectional view of an integrated circuit package system 700 in yet another alternative embodiment of the present invention. In a manner similar to the integrated circuit package system 100, the integrated circuit package system 700 includes a multi-planar paddle 702 with an uplift rim 704 having a top rim surface 706. The multi-planar paddle 702 further includes a paddle base 708 having a top base surface 710. An integrated circuit 714 attaches to the multi-planar paddle 702 with a first mounting layer 718, such as an epoxy, and a second mounting layer 720, such as a film. The first mounting layer 718 is applied between the top base surface 710 and the integrated circuit 714. The second mounting layer 720 is applied between the top rim surface 706 and the integrated circuit 714.

Figure 8:
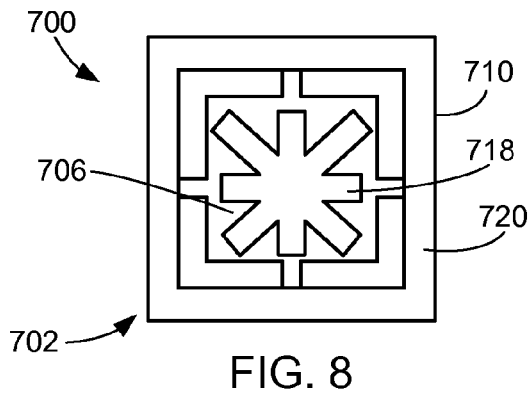
FIG. 8 is a plan view of the integrated circuit package system in a mounting layer applying phase.

Referring now to FIG. 8, therein is shown a plan view of the integrated circuit package system 700 in a mounting layer applying phase. The first mounting layer 718 and the second mounting layer 720 are applied to the multi-planar paddle 702. For the integrated circuit package system 700, the first mounting layer 718 is applied to the top base surface 710 of the paddle base 708 of FIG. 7 and the second mounting layer 720 is applied to the top rim surface 706 of the uplift rim 704 of FIG. 7. The first mounting layer 718, the second mounting layer 720, and the multi-planar paddle 702 provide support and adhesion to the integrated circuit 714 of FIG. 7 for overhang and bounce effect, particularly with large die applications.

Figure 9:
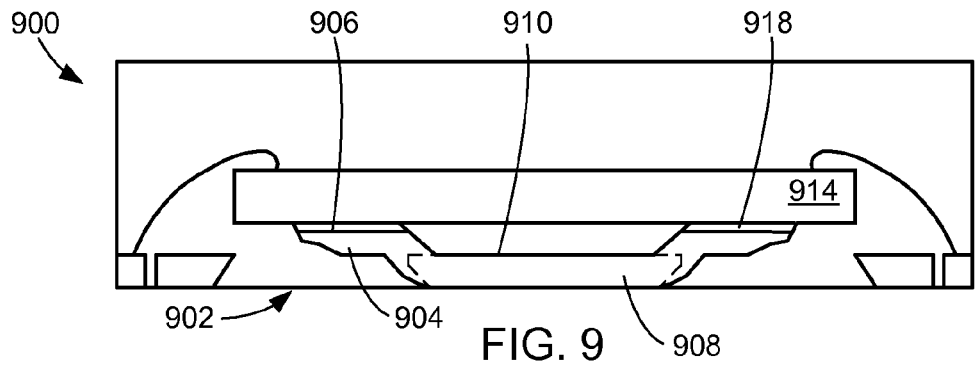
FIG. 9 is a cross-sectional view of an integrated circuit package system in yet another alternative embodiment of the present invention.

Referring now to FIG. 9, therein is shown a cross-sectional view of an integrated circuit package system 900 in yet another alternative embodiment of the present invention. In a manner similar to the integrated circuit package system 100, the integrated circuit package system 900 includes a multi-planar paddle 902 with an uplift rim 904 having a top rim surface 906. The multi-planar paddle 902 further includes a paddle base 908 having a top base surface 910. An integrated circuit 914 attaches to the multi-planar paddle 902 with a mounting layer 918, such as an epoxy. The mounting layer 918 is applied between the top rim surface 906 and the integrated circuit 914.

Figure 10:
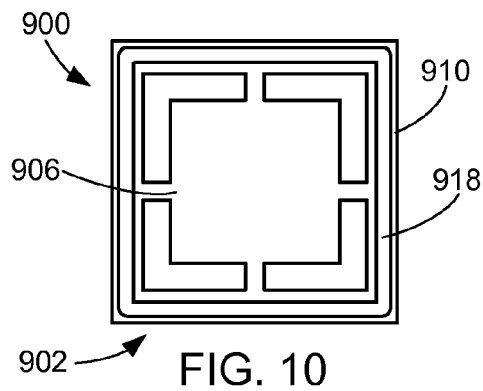
FIG. 10 is a plan view of the integrated circuit package system in a mounting layer applying phase.

Referring now to FIG. 10, therein is shown a plan view of the integrated circuit package system 900 in a mounting layer applying phase. The mounting layer 918 is applied to the multi-planar paddle 902. For the integrated circuit package system 900, the mounting layer 918 is applied to the top rim surface 906 of the uplift rim 904 of FIG. 9. The mounting layer 918 and the multi-planar paddle 902 provide support and adhesion to the integrated circuit 914 of FIG. 9 for overhang and bounce effect, particularly with large die applications.

Figure 11:
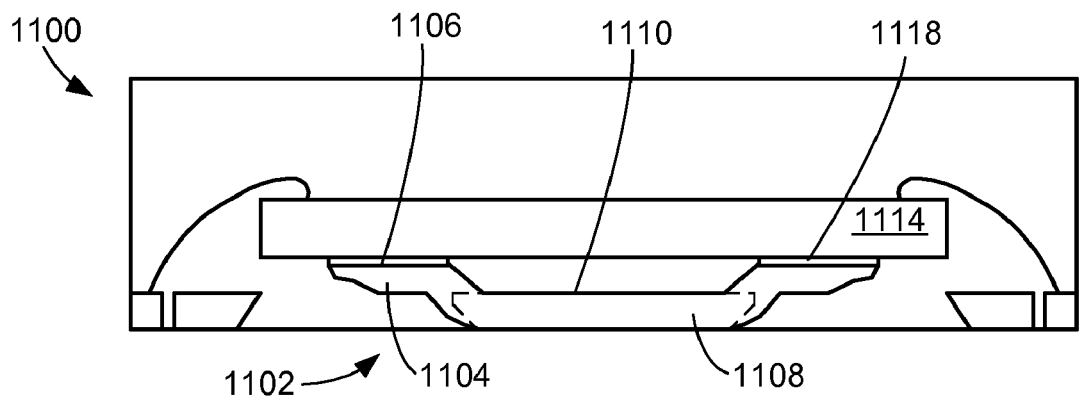
FIG. 11 is a cross-sectional view of an integrated circuit package system in yet another alternative embodiment of the present invention.

Referring now to FIG. 11, therein is shown a cross-sectional view of an integrated circuit package system 1100 in yet another alternative embodiment of the present invention. In a manner similar to the integrated circuit package system 100, the integrated circuit package system 1100 includes a multi-planar paddle 1102 with an uplift rim 1104 having a top rim surface 1106. The multi-planar paddle 1102 further includes a paddle base 1108 having a top base surface 1110. An integrated circuit 1114 attaches to the multi-planar paddle 1102 with a mounting layer 1118, such as a film. The mounting layer 1118 is applied between the top rim surface 1106 and the integrated circuit 1114.

Figure 12:
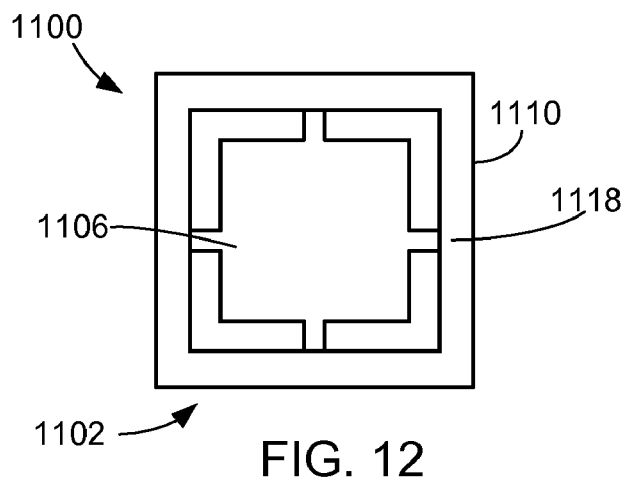
FIG. 12 is a plan view of the integrated circuit package system in a mounting layer applying phase.

Referring now to FIG. 12, therein is shown a plan view of the integrated circuit package system in a mounting layer applying phase. The mounting layer 1118 is applied to the multi-planar paddle 1102. For the integrated circuit package system 1100, the mounting layer 1118 is applied to the top rim surface 1106 of the uplift rim 1104 of FIG. 11. The mounting layer 1118 and the multi-planar paddle 1102 provide support and adhesion to the integrated circuit 1114 of FIG. 11 for overhang and bounce effect, particularly with large die applications.

Figure 13:
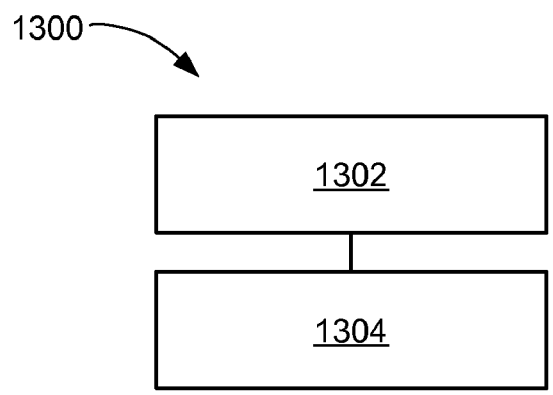
FIG. 13 is a flow chart of an integrated circuit package system for manufacturing the integrated circuit package system in an embodiment of the present invention.

Referring now to FIG. 13 is a flow chart of an integrated circuit package system 1300 for manufacturing the integrated circuit package system 100 in an embodiment of the present invention. The system 1300 includes forming a multi-planar paddle having an uplift rim in a block 1302; and attaching an integrated circuit over the uplift rim of the multi-planar paddle in a block 1304.

In greater detail, a method to fabricate the integrated circuit package system 100, in an embodiment of the present invention, is performed as follows:
1. Forming a multi-planar die paddle having an uplift rim in a plane above a plane of a paddle base. (FIG. 1)
2. Attaching an integrated circuit over the uplift rim and the paddle base of the multi-planar paddle. (FIG. 1)

It has been discovered that the present invention thus has numerous aspects.

An aspect is that the present invention provides the multi-planar paddle. The multi-planar paddle includes the uplift rim for attachment of the integrated circuit on the top rim surface. The planed of the uplift rim is formed above the plane of the paddle base.

Another aspect is that the present invention provides the open pad design for the multi-planar paddle. Open pad design includes the support bars between the paddle base and the uplift rim. The support bars provide open regions between the paddle base and the uplift rim.

Another aspect is that the present invention provides the closed pad design for the multi-planar paddle. Closed pad design includes the support surface between the paddle base and the uplift rim. The support surface provides a contiguous region between the paddle base and the uplift rim without any openings.

Another aspect is that the present invention provides multiple rows of leads. Any number of rows including the leads can be provided. The leads are accessible around the perimeter of the multi-planar paddle.

It has been discovered that the disclosed structure prevents short circuits. Short circuits between the integrated circuit and the leads are prevented by mounting the integrated circuit in a plane above the plane of the leads, particularly with large die applications.

It has also been discovered that the disclosed structure provides support for the integrated circuit. The multi-planar paddle and the mounting layers provide support and adhesion for the integrated circuit die over the top rim surface and the top base surface.

Yet another discovery is that the disclosed structure reduces the bounce effect. The multi-planar paddle provides structural integrity and flexibility for the integrated circuit mounted over the top rim surface and the top base surface.

Yet another discovery is that the disclosed structure provides improved electrical connector efficiency. The multi-planar paddle provides reduced electrical connector lengths and loops particularly with large die applications.

Yet another discovery is that the disclosed structure provides many die attach process concepts. The top rim surface and the top base surface provide many and varied combinations of attachment methods and materials.

Yet another discovery of the disclosed structure is die size flexibility. Many different die size applications can be accommodated by the multi-planar paddle particularly with large die size applications.

Yet another discovery of the disclosed structure is compatibility with quad leadless packages such as the dual row, punch singulated, quad leadless package. The multi-planar paddle significantly improves the die size flexibility with quad leadless packages.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    forming a multi-planar paddle having an outer uplift rim;
    attaching an integrated circuit over the uplift rim of the multi-planar paddle, the integrated circuit providing an overhang of the integrated circuit over the multi-planar paddle with improved spacing between the integrated circuit and multiple rows of leads along a side of the integrated circuit; and
    forming an encapsulation on the multi-planar paddle and on the integrated circuit, a bottom surface of the multi-planar paddle exposed from the encapsulation.

2. The method as claimed in claim 1 wherein forming the multi-planar paddle comprises forming an open pad configuration.

3. The method as claimed in claim 1 wherein forming the multi-planar paddle comprises forming a closed pad configuration.

4. The method as claimed in claim 1 further comprising attaching electrical connectors to the integrated circuit and the multiple rows of leads.

5. An integrated circuit package system comprising:
    a multi-planar paddle having an outer uplift rim; and
    an integrated circuit over the uplift rim of the multi-planar paddle, the integrated circuit includes an overhang of the integrated circuit over the multi-planar paddle with improved spacing between the integrated circuit and multiple rows of leads along a side of the integrated circuit; and
    an encapsulation formed on the multi-planar paddle and on the integrated circuit, a bottom surface of the multi-planar paddle exposed from the encapsulation.

6. The system as claimed in claim 5 wherein the multi-planar paddle comprises an open pad configuration.

7. The system as claimed in claim 5 wherein the multi-planar paddle comprises a closed pad configuration.

8. The system as claimed in claim 5 further comprising electrical connectors attached to the integrated circuit and the multiple rows of leads.

9. The system as claimed in claim 5 wherein:
    the multi-planar paddle having the uplift rim in a plane above a plane of a paddle base; and
    the integrated circuit over the uplift rim and the paddle base of the multi-planar paddle.

10. The system as claimed in claim 9 wherein the integrated circuit comprises an epoxy on the uplift rim and the paddle base.

11. The system as claimed in claim 9 wherein the integrated circuit comprises a film on the uplift rim and an epoxy on the paddle base.

12. The system as claimed in claim 9 wherein the integrated circuit comprises an epoxy on the uplift rim.

13. The system as claimed in claim 9 wherein the integrated circuit comprises a film on the uplift rim.

* * * * *